(12) United States Patent
Zhang

(10) Patent No.: US 10,121,874 B2
(45) Date of Patent: Nov. 6, 2018

(54) SELF-ALIGNED BOTTOM UP GATE CONTACT AND TOP DOWN SOURCE-DRAIN CONTACT STRUCTURE IN THE PREMETALLIZATION DIELECTRIC OR INTERLEVEL DIELECTRIC LAYER OF AN INTEGRATED CIRCUIT

(71) Applicant: STMicroelectronics, Inc., Coppell, TX (US)

(72) Inventor: John Hongguang Zhang, Fishkill, NY (US)

(73) Assignee: STMicroelectronics, Inc., Coppell, TX (US)

(*) Notice: Subject to any disclaimer, the term of this patent is extended or adjusted under 35 U.S.C. 154(b) by 0 days.

(21) Appl. No.: 15/485,754

(22) Filed: Apr. 12, 2017

(65) Prior Publication Data

US 2017/0222018 A1    Aug. 3, 2017

Related U.S. Application Data

(62) Division of application No. 14/734,013, filed on Jun. 9, 2015, now Pat. No. 9,679,847.

(51) Int. Cl.
*H01L 29/66* (2006.01)
*H01L 21/768* (2006.01)
(Continued)

(52) U.S. Cl.
CPC .. *H01L 29/66545* (2013.01); *H01L 21/28088* (2013.01); *H01L 21/768* (2013.01); *H01L 21/76877* (2013.01); *H01L 21/76885* (2013.01); *H01L 21/76897* (2013.01); *H01L 23/528* (2013.01); *H01L 23/535* (2013.01); *H01L 29/4238* (2013.01); *H01L 29/42376* (2013.01);

(Continued)

(58) Field of Classification Search
CPC . H01L 23/528; H01L 29/6656; H01L 23/535; H01L 29/78; H01L 21/768; H01L 29/66545
USPC .......................................................... 257/368
See application file for complete search history.

(56) References Cited

U.S. PATENT DOCUMENTS

2012/0061738 A1    3/2012  Yin et al.
2012/0313153 A1   12/2012  Zhang et al.
(Continued)

OTHER PUBLICATIONS

Search Report for co-pending DE Appl. No. 102015120483.5 (dated Nov. 3, 2016).

*Primary Examiner* — Fernando L Toledo
*Assistant Examiner* — Adam S Bowen
(74) *Attorney, Agent, or Firm* — Crowe & Dunlevy

(57) ABSTRACT

An integrated circuit includes a source-drain region, a channel region adjacent to the source-drain region, a gate structure extending over the channel region and a sidewall spacer on a side of the gate structure and which extends over the source-drain region. A dielectric layer is provided in contact with the sidewall spacer and having a top surface. The gate structure includes a gate electrode and a gate contact extending from the gate electrode as a projection to reach the top surface. The side surfaces of the gate electrode and a gate contact are aligned with each other. The gate dielectric layer for the transistor positioned between the gate electrode and the channel region extends between the gate electrode and the sidewall spacer and further extends between the gate contact and the sidewall spacer.

23 Claims, 13 Drawing Sheets

(51) Int. Cl.
  *H01L 23/528*   (2006.01)
  *H01L 23/535*   (2006.01)
  *H01L 29/78*    (2006.01)
  *H01L 21/28*    (2006.01)
  *H01L 29/423*   (2006.01)
  *H01L 29/49*    (2006.01)
  *H01L 29/51*    (2006.01)
  *H01L 29/786*   (2006.01)

(52) U.S. Cl.
  CPC .... *H01L 29/42384* (2013.01); *H01L 29/4966* (2013.01); *H01L 29/517* (2013.01); *H01L 29/6656* (2013.01); *H01L 29/66795* (2013.01); *H01L 29/78* (2013.01); *H01L 29/785* (2013.01); *H01L 29/78645* (2013.01); *H01L 29/78696* (2013.01)

(56) References Cited

U.S. PATENT DOCUMENTS

2013/0256802 A1* 10/2013 Jagannathan ..... H01L 21/28518
                257/368
2014/0117466 A1  5/2014  Jagannathan et al.
2014/0124865 A1  5/2014  Zhang
2015/0194517 A1  7/2015  Zang

* cited by examiner

SELF-ALIGNED BOTTOM UP GATE CONTACT AND TOP DOWN SOURCE-DRAIN CONTACT STRUCTURE IN THE PREMETALLIZATION DIELECTRIC OR INTERLEVEL DIELECTRIC LAYER OF AN INTEGRATED CIRCUIT

CROSS REFERENCE TO RELATED APPLICATION

This application is a divisional application from U.S. application for patent Ser. No. 14/734,013 filed Jun. 9, 2015, the disclosure of which is incorporated herein by reference.

TECHNICAL FIELD

The present invention relates to integrated circuits and, in particular, to the formation of metal-filled contacts in the premetallization dielectric (PMD) or interlevel dielectric (ILD) layers of an integrated circuit the purpose of connecting to gate, source and drain regions of a transistor.

BACKGROUND

Reference is now made to FIGS. 1A and 1B showing the general configuration of a conventional metal oxide semiconductor (MOS) field effect transistor (FET) 10 device. FIGS. 1A and 1B are parallel cross-sections taken at different locations along the width of the transistor gate in a direction perpendicular to the gate width. A substrate 12 supports the transistor. In this example, the substrate is of the silicon-on-insulator substrate 12 type which includes a substrate layer 14, a buried oxide (BOX) layer 16 and a semiconductor layer 18. An active region 20 for the transistor device is delimited by a peripherally surrounding shallow trench isolation 22 that penetrates through the layer 18. Within the active region 20, the layer 18 is divided into a plurality of channel regions 30 which have been doped with a first conductivity type dopant, a plurality of source regions 32 (each adjacent a channel region 30 on one side) which have been doped with a second conductivity type dopant, and a plurality of drain regions 34 (each adjacent a channel region 30 on an opposite side from the source region 32) which have also been doped with the second conductivity type dopant. Where the MOSFET 10 device is of the p-channel type, the first conductivity type dopant is n-type and the second conductivity type is p-type. Conversely, where the MOSFET device is of the n-channel type, the first conductivity type dopant is p-type and the second conductivity type is n-type. A plurality of gate stacks 36 are provided above the channel region 30. Each gate stack 36 typically comprises a gate dielectric 38, a gate electrode 40 (for example, of metal and/or polysilicon material) and sidewall spacers 42 made of an insulating material such as silicon nitride (SiN) deposited on the sides of the gate dielectric 38 and gate electrode 40 and on top of the gate electrode. An interlevel dielectric (ILD) or pre-metallization dielectric (PMD) layer 46 is provided above the substrate and the gate stack. A top surface 48 of the layer 46 is processed with a chemical-mechanical polishing (CMP) process to define a planar surface. A set of metal contacts 50, typically formed of tungsten, extend from the top surface 48 through the ILD/PMD layer 46 in metal-filled contact openings to make electrical contact with the source region 32 and drain region 34 (shown in cross-section FIG. 1A) and gate electrode 40 (shown in cross-section FIG. 1B). A first metallization layer M1 is then provided above the ILD/PMD layer 46, with the first metallization layer M1 comprising metal lines 54 formed in metal-filled via and/or trench openings in contact with the contacts 50 and surrounded by a planarized dielectric material layer 56.

As feature sizes in integrated circuit devices continue to shrink, it is becoming more complicated and challenging to provide source, drain and gate contacts in middle of line (MOL) interconnection. The reasons for this are numerous. For example, the gate contact may need to be moved away from the active area 22 (for example, over the peripheral isolation 22 as shown in FIG. 1B) in order to avoid shorting between the gate contact and the trench silicide of the source-drain regions. This is a disadvantage because it results in an increase in chip area. To address this issue, integrated circuit designers are moving towards merged fin structure and shared source-drain structures. There is a noted drawback with this technology, however, because of increased contact resistance at the source-drain regions due to reduced contact area (as generally shown in FIG. 1A at reference 60). Misalignment of the gate and the gate contact is another concern (see, FIG. 1B at reference 62), and this can lead to concerns with shorting of the gate to the source-drain contact.

There is accordingly a need in the art for an improved MOL interconnection to source, drain and gate regions of a transistor integrated circuit.

SUMMARY

The foregoing and other problems are addressed by an MOL interconnection using: a bottom up formation of the gate contact so as to avoid misalignment between the gate and gate contact, and a top down formation of source-drain contacts with sizes sufficient to reduce contact resistance and avoid shorting concerns. The gate contact vias are preferably protected by high K and low K materials in order to improve reliability for high density integrations.

In an embodiment, an integrated circuit comprises: a source-drain region; a channel region adjacent to the source-drain region; a gate structure extending over the channel region; a sidewall spacer on a side of the gate structure and which extends over the source-drain region; and a dielectric layer in contact with the sidewall spacer and having a top surface. The gate structure comprises: a gate electrode; a gate contact extending from the gate electrode to the top surface; and a gate dielectric layer between the gate electrode and the channel region and extending between the gate electrode and the sidewall spacer and further extending between the gate contact and the sidewall spacer.

In an embodiment, an integrated circuit comprises: a source-drain region; a channel region adjacent to the source-drain region; a gate structure extending over the channel region; a sidewall spacer on a side of the gate structure and which extends over the source-drain region; and a dielectric layer in contact with the sidewall spacer and having a top surface. The gate structure comprises: a gate electrode; and a gate contact extending from the gate electrode to the top surface; wherein a side surface of the gate electrode and a side surface of the gate contact are aligned with each other and extend parallel to an inner surface of the sidewall spacer.

In an embodiment, a method comprises: forming a dummy gate structure extending over a channel region, said dummy gate structure comprising a dummy gate electrode and sidewall spacers on each side of the dummy gate electrode that extend over a source-drain region adjacent the channel region; removing the dummy gate electrode to form an opening between the sidewall spacers; forming a replacement metal gate within the opening, said replacement metal gate comprising a dielectric liner and a metal portion; block masking a portion of the replacement metal gate where a gate contact is desired; recessing the replacement metal gate except at said portion that is block masked to form a gate electrode where replacement metal gate is recessed and said gate contact where the replacement metal gate is block masked; and providing a dielectric layer.

BRIEF DESCRIPTION OF THE DRAWINGS

For a better understanding of the embodiments, reference will now be made by way of example only to the accompanying figures in which.

The illustrations provided are not necessarily drawn to scale.

DETAILED DESCRIPTION OF THE DRAWINGS

Reference is now made to FIGS. 2-24 which illustrate process steps for the fabrication of contacts.

Figure 1A:
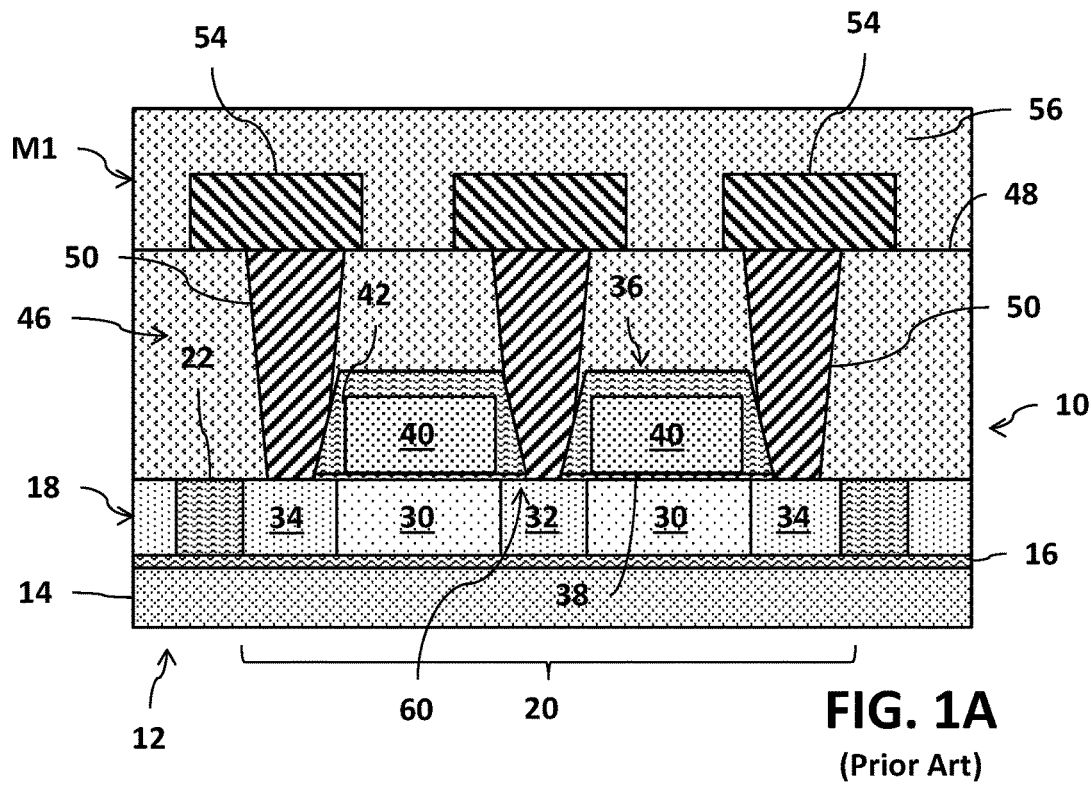
FIGS. 1A and 1B illustrate the configuration of a prior art MOSFET device.
Figure 1B:
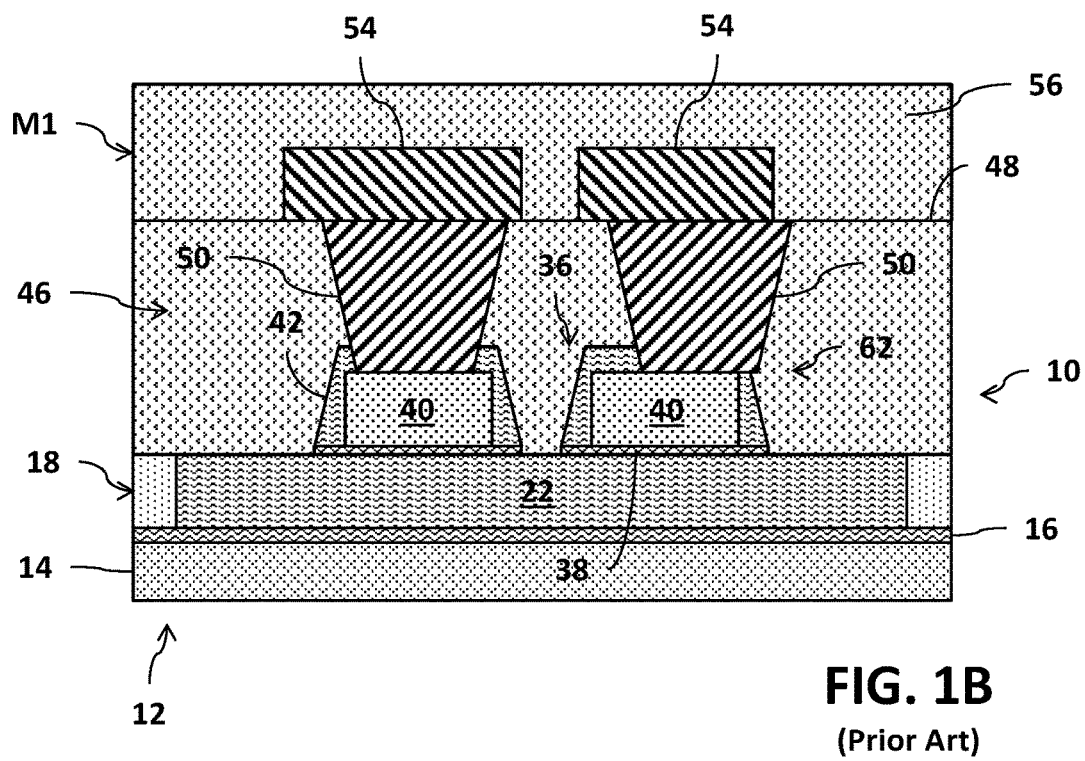
Figure 2:
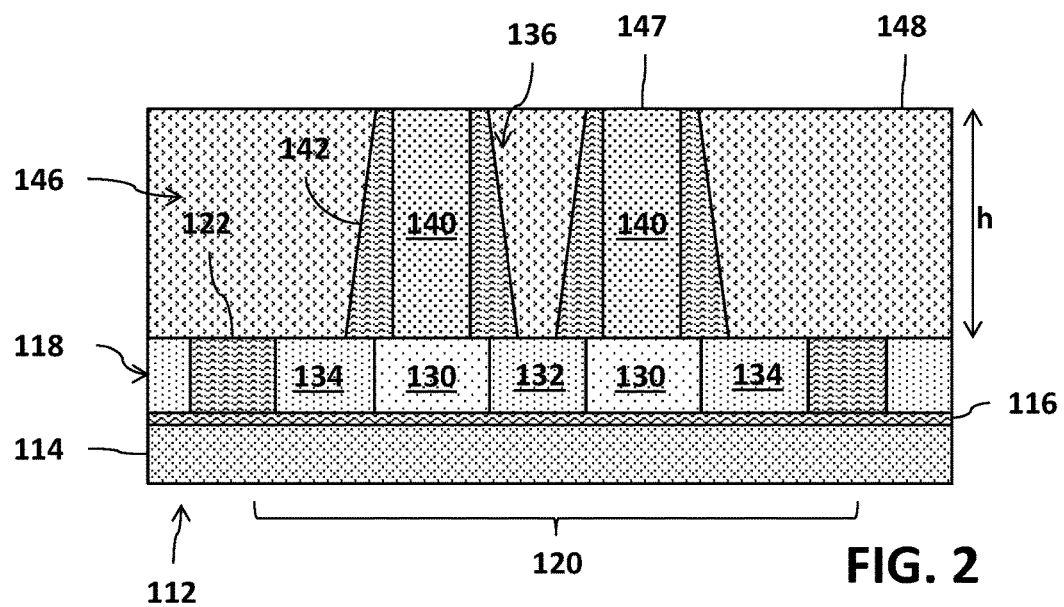
FIGS. 2-24 illustrate process steps for the fabrication of contacts.

With reference to FIG. 2, a substrate 112 includes an active region 120 delimited by a peripherally surrounding shallow trench isolation 122. The substrate 112 may, for example, be of the silicon-on-insulator (SOI) type including a substrate layer 114, a buried oxide (BOX) layer 116 and a semiconductor layer 118. Within the active region 120, the layer 118 is divided into a plurality of channel regions 130 which have been doped with a first conductivity type dopant, a plurality of source regions 132 (each adjacent a channel region 130 on one side) which have been doped with a second conductivity type dopant, and a plurality of drain regions 134 (each adjacent a channel region 130 on an opposite side from the source region 132) which have also been doped with the second conductivity type dopant. In connection with the formation of a p-channel type transistor, the first conductivity type dopant is n-type and the second conductivity type is p-type. Conversely, in connection with the formation of an n-channel type transistor, the first conductivity type dopant is p-type and the second conductivity type is n-type.

A plurality of dummy gate stacks 136 are provided above the channel regions 130. Each dummy gate stack 136 typically comprises a sacrificial polysilicon gate electrode 140 and sidewall spacers 142 made of an insulating material such as silicon nitride (SiN) deposited on the sides of the sacrificial gate electrode 140. The sacrificial polysilicon gate electrode 140 may, for example, have a length of 5-30 nm (with any suitable width according to the application, for example, 10-100 nm) and the sidewall spacers 142 may, for example, have a thickness of 4-20 nm. The pitch of the dummy gate stacks 136 may comprise 40-50 nm. An insulating layer 146 is provided above the substrate on each side of the dummy gate stack 136. A top surface 148 of the layer 146 is processed with a chemical-mechanical polishing (CMP) process to define a planar surface which exposes the top surface 147 of the sacrificial polysilicon gate electrode 140. This is referred to in the art as a poly open chemical-mechanical polish (POC). A height h of the sacrificial polysilicon gate electrode 140 (and thus also the heights of the layer 146 and sidewall spacers 142) is selected so as to substantially equal a desired height of an interlevel dielectric (ILD) or pre-metallization dielectric (PMD) region of the integrated circuit. The height h may, for example, be 120-140 nm.

In a FinFET embodiment, the semiconductor layer 118 is patterned to form a plurality of parallel fins, with each fin including source, channel and drain regions. Each fin may have a height of 10-30 nm and a width of 6-10 nm, with a pitch between each of the parallel fins of 25-40 nm. In this configuration, the plurality of dummy gate stacks 136 extend perpendicular to the length of the fins in a configuration known in the art which straddles over each fin on three sides. The cross-section of FIG. 2 would thus illustrate a cross-section taken along the length of only one of the plurality of fins, each of the other fins having a similar cross-sectional configuration.

Figure 3:
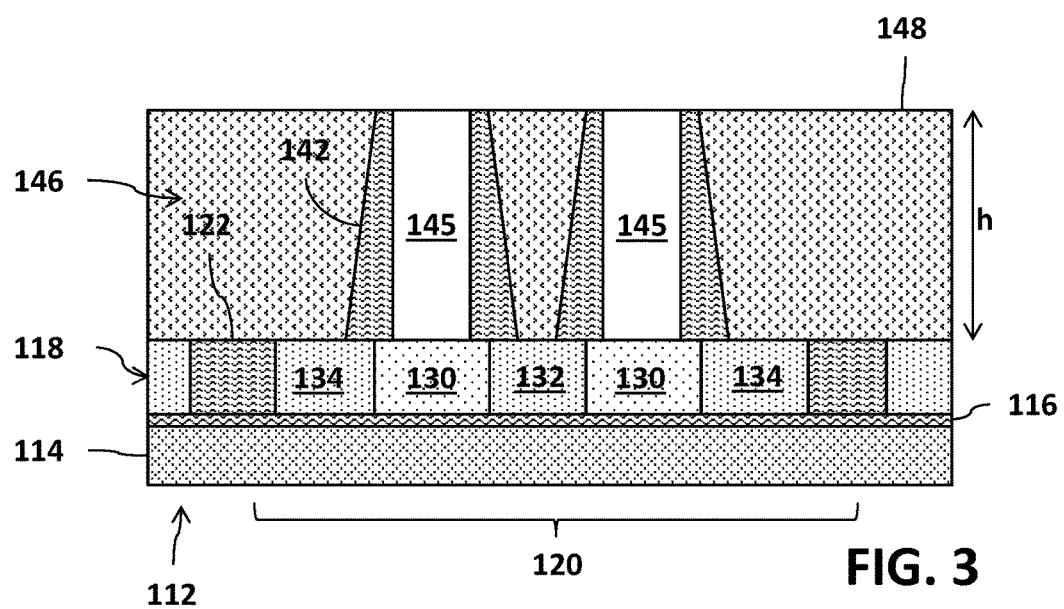

An etch process (for example, a dry recess 30 nm (20 s)+DHF (45 s)+SC1 (300 s)+hot $NH_4OH$ at 65° C. etch) is then performed to selectively remove the sacrificial polysilicon gate electrode 140 and leave openings 145 between the sidewall spacers 142. The result is shown in FIG. 3.

Figure 4:
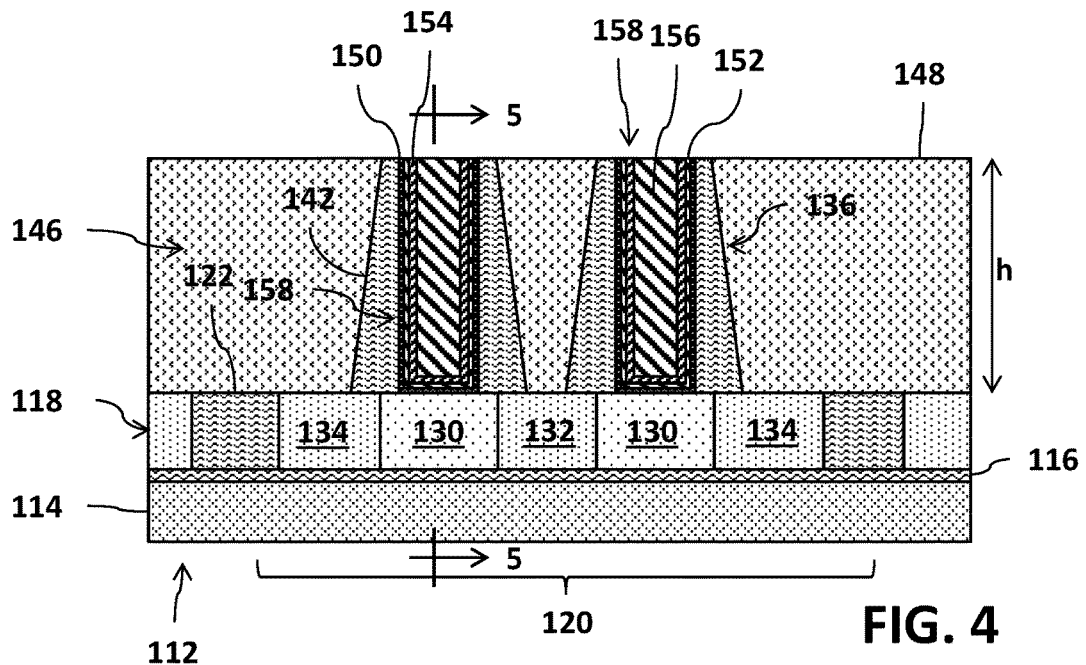

A conformal deposit of a high K dielectric material is then made within the openings 145 to form a dielectric liner 150. The high K dielectric material may, for example, comprise hafnium oxide ($HfO_2$) deposited using an atomic layer deposition process with a thickness of 2-10 nm. The liner 150 is deposited at the bottom of the opening 145 in contact with the gate region 130 to define the gate dielectric of the transistor. A conformal deposit of a metal material is then made within the openings 145 to form a metal liner 152. The metal material may, for example, comprise TiN/TiC deposited using an atomic layer deposition process with a thickness of 2-8 nm. This metal liner 152 may, for example, function as a barrier layer. A conformal deposit of a work function material is then made within the openings 145 to form work function layer 154. The work function material may, for example, comprise a multi-layer of TiN, TiC and TiN deposited using atomic layer deposition processes with a total thickness of 5-10 nm (for example, 1 nm TiN, 3 nm TiC and 1 nm TiN). The work function material is provided to control the operating threshold of the transistor. The remaining vacant portion of each opening 145 is then filled with a metal fill material. The metal fill may, for example, comprise tungsten deposited using a thermal chemical vapor deposition process. The metal fill forms the gate electrode of the transistor. A chemical-mechanical polishing (CMP) process is used to remove excess portions of the liners 150 and 152, layer 154 and fill 156. The foregoing process is analogous to the replacement metal gate process known in the art, and thus the liners 150 and 152, layer 154 and fill 156 are collectively referred to as a replacement gate structure 158. The result is shown in FIG. 4.

Figure 5:
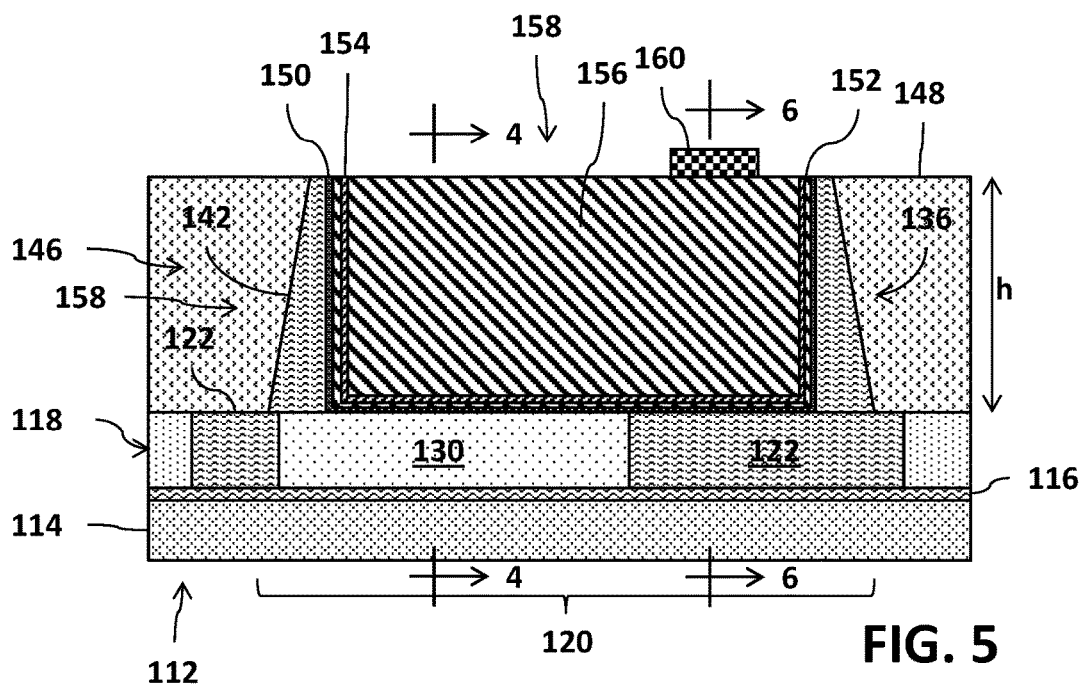
Figure 6:
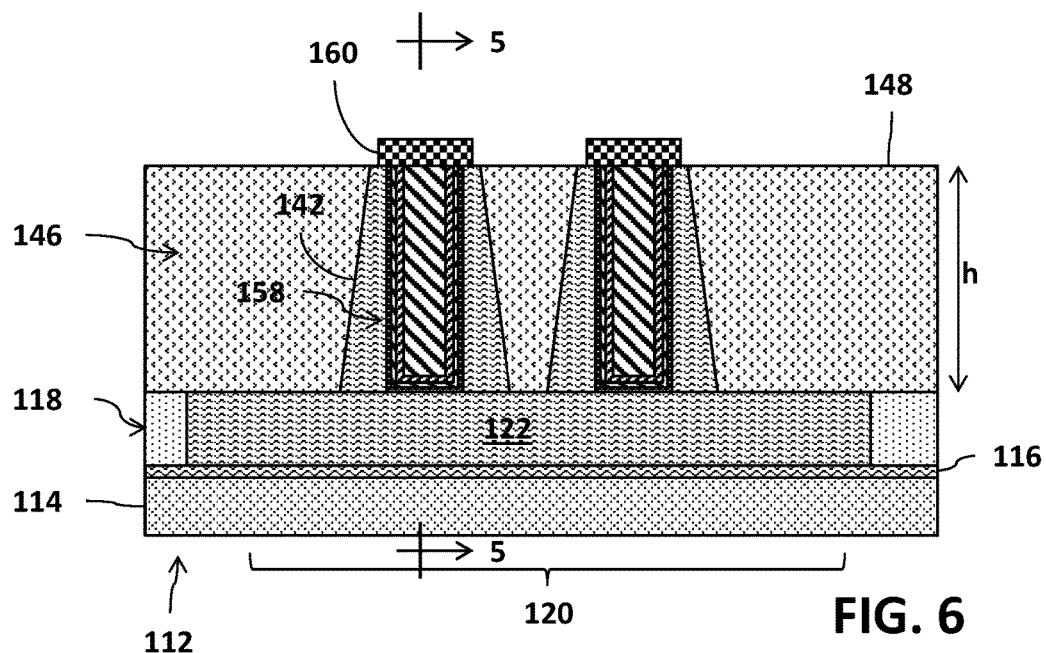

A blocking mask 160 is then formed over a portion of the replacement gate structure 158 where a gate contact is desired. The result is shown in FIG. 5 (which is an orthogonal cross-section of FIGS. 4 and 6, wherein FIG. 6 is a parallel cross-section to FIG. 4). Any suitable deposit and lithographic patterning process known in the art can be used to form the blocking mask 160. The dimensions of the blocking mask may, for example, be: length 5-30 nm and width 10-30 nm.

Figure 7:
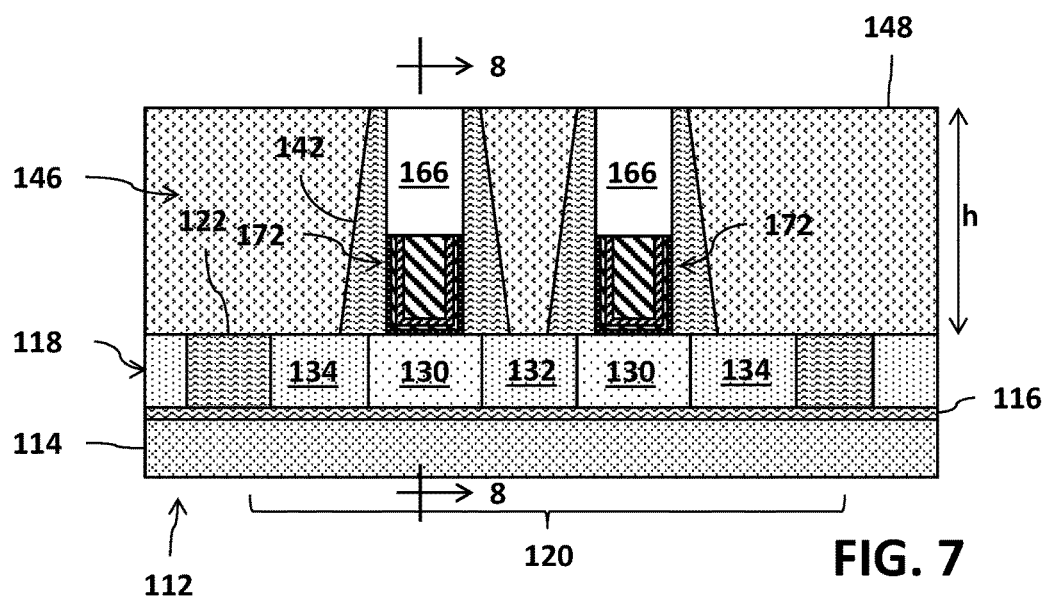
Figure 8:
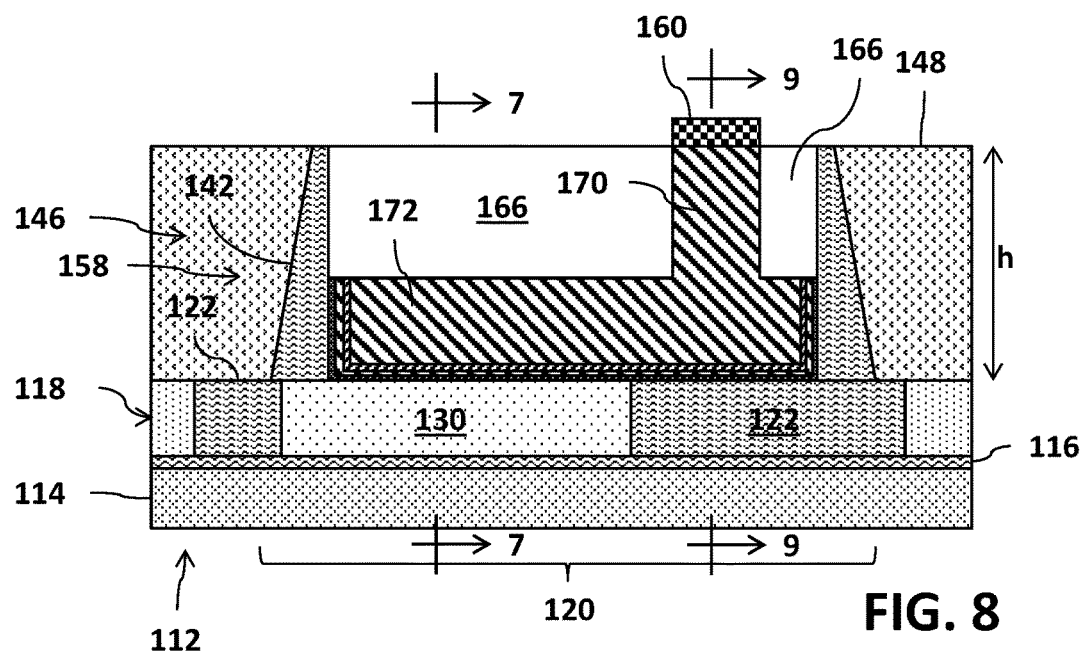

A selective reactive ion etch (RIE) is then performed to recess the liners 150 and 152, layer 154 and fill 156 of the replacement gate structure 158 which are not protected by the blocking mask 160. This etch does not materially attack the sidewall spacers 142 or layer 146. The result is shown in FIGS. 7-9 to produce openings 166 between the sidewall spacers 142 and leave a portion of the replacement gate structure 158 located under the blocking mask 160 to provide a gate electrode contact 170 with the recessed portion of the replacement gate structure 158 forming a replacement metal gate 172.

Figure 9:
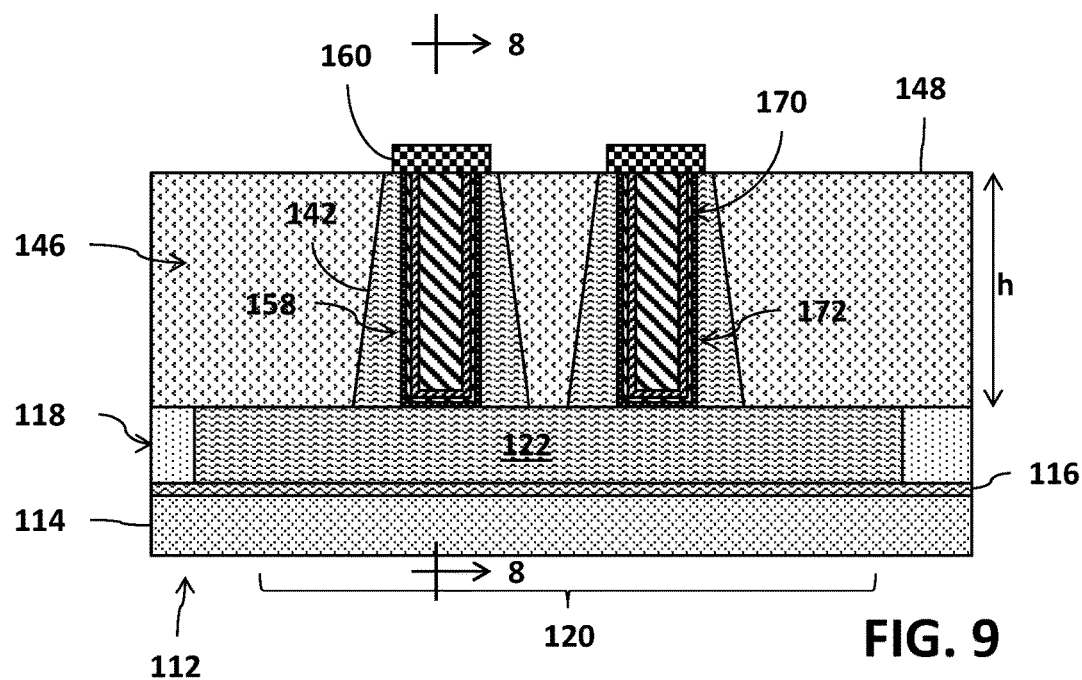

With specific reference to FIG. 9, it will be noted that the sidewalls of the gate electrode contact 170 portion of the replacement gate structure 158 and the sidewalls of the replacement metal gate 172 portion of the replacement gate structure 158 are aligned with each other and defined by the inner surface of the sidewall spacers 142 for all of the height h (i.e., the outer surface of the replacement gate structure 158 and the inner surface of the sidewall spacer 142 are adjacent and parallel). Thus, the gate electrode contact 170 portion is self-aligned with the replacement metal gate 172 portion at least in the cross-section of FIG. 9. This results because the gate electrode contact 170 is bottom up fabricated by filling each opening 145 as described above. It will further be noted that the high K dielectric layer 150 (which is also the gate dielectric between the replacement metal gate 172 and the channel region) is provided to extend between the metal portions of the replacement metal gate 172 and the sidewall spacers 142 and further extend between the metal portions of the gate electrode contact 170 and the sidewall spacers 142.

Figure 10:
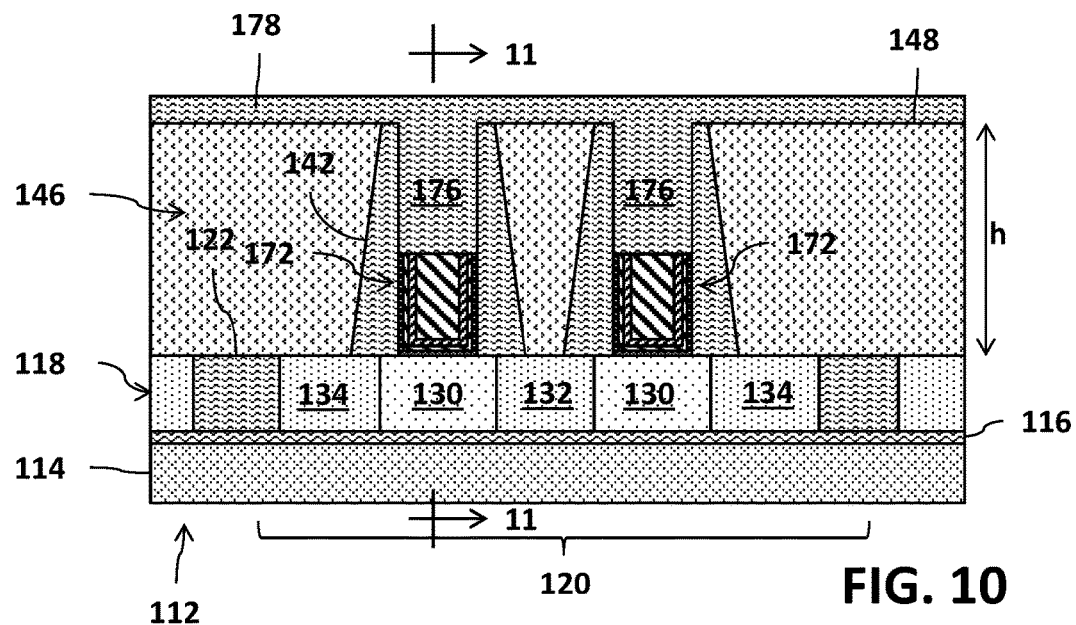
Figure 11:
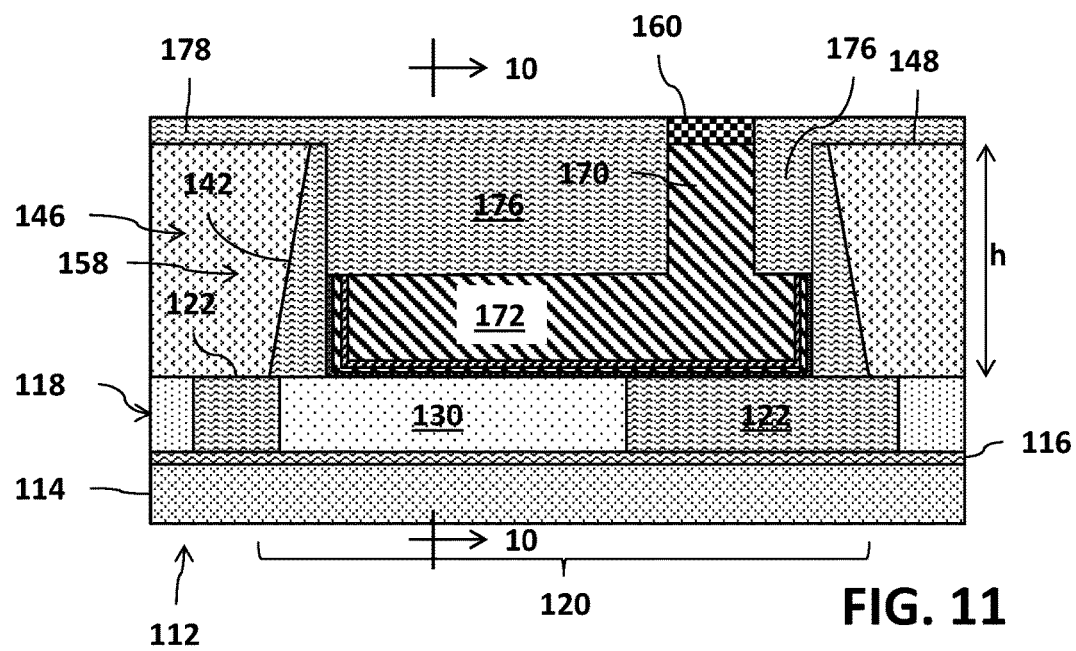

A deposit of an insulating fill material is then made to fill the openings 166 and form a cap 176 and overlying layer 178. The insulating fill material may, for example, comprise silicon nitride (SiN) or a low K dielectric material (such as SiOCN or SiBCN). A chemical-mechanical polishing (CMP) process is used to remove excess portions of the insulating fill material, with the polish stopping at the top of the blocking mask 160. The result is shown in FIGS. 10-11. With the use of a low K dielectric material, it will be noted that a low K dielectric is provided in addition to the high K dielectric so that the gate electrode contact 170 is surrounded by dielectric materials (see, FIGS. 9 and 11).

Figure 12:
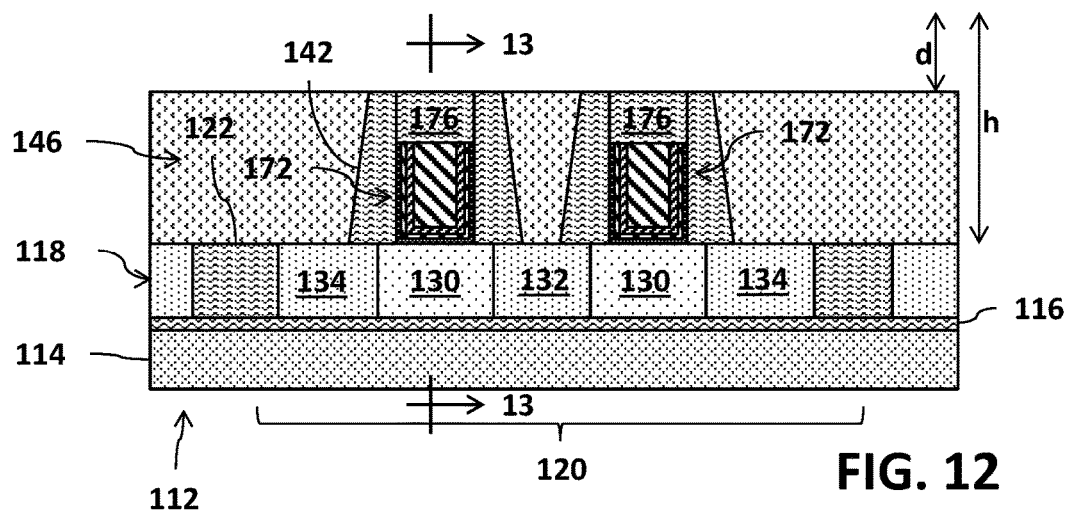
Figure 13:
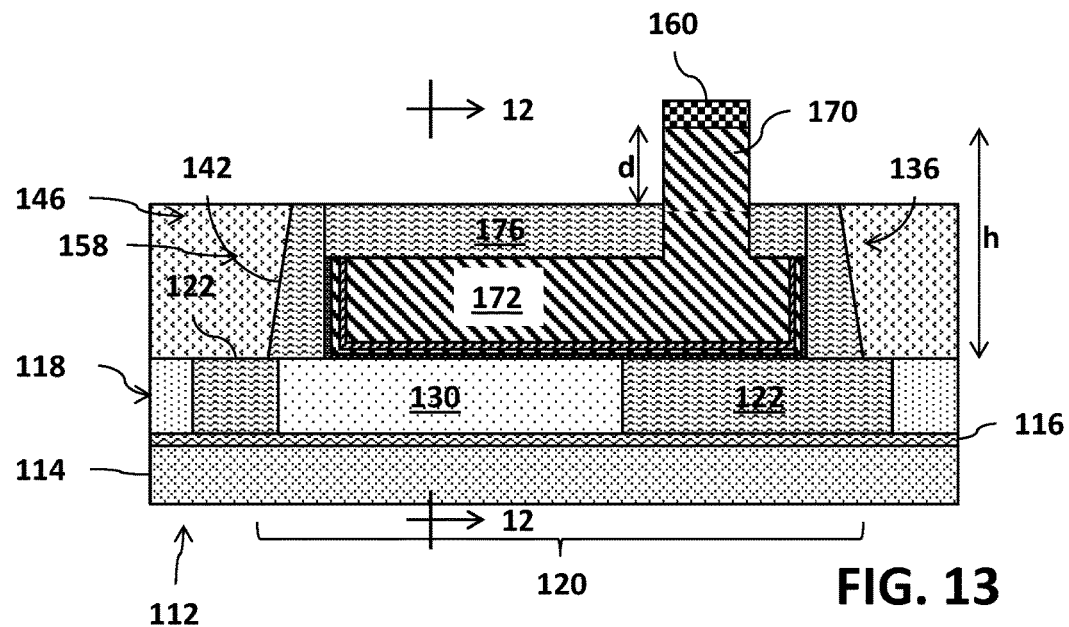
Figure 14:
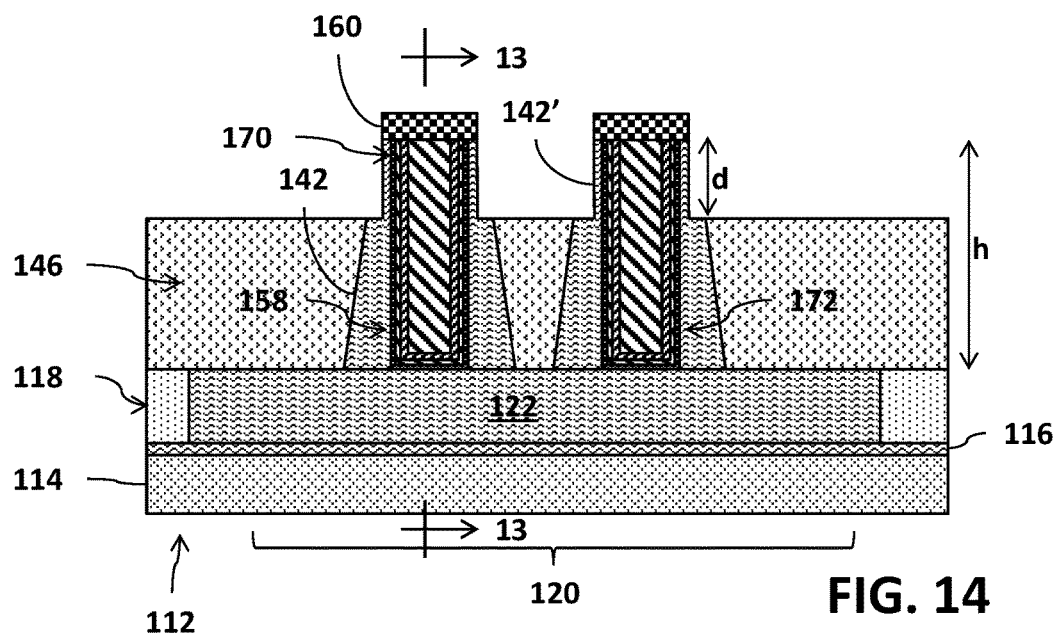

A non-selective reactive ion etch (RIE) is performed to recess the layer 146 and sidewall spacers 142 that are not protected by the mask 160. The recess is made to a depth d which does not reach the top of the recessed portion of the replacement gate structure 158 forming the replacement metal gate 172. A gas cluster ion beam (GCIB) process is then used to ensure uniformity of the recess depth. The result is shown in FIGS. 12-14. The depth may, for example, be 60-80 nm. It will be noted that a thin portion 142' of the sidewall spacers 142 (3-10 nm, for example, in thickness) remains on each side of the gate electrode contact 170 as shown in the cross-section of FIG. 14.

Figure 15:
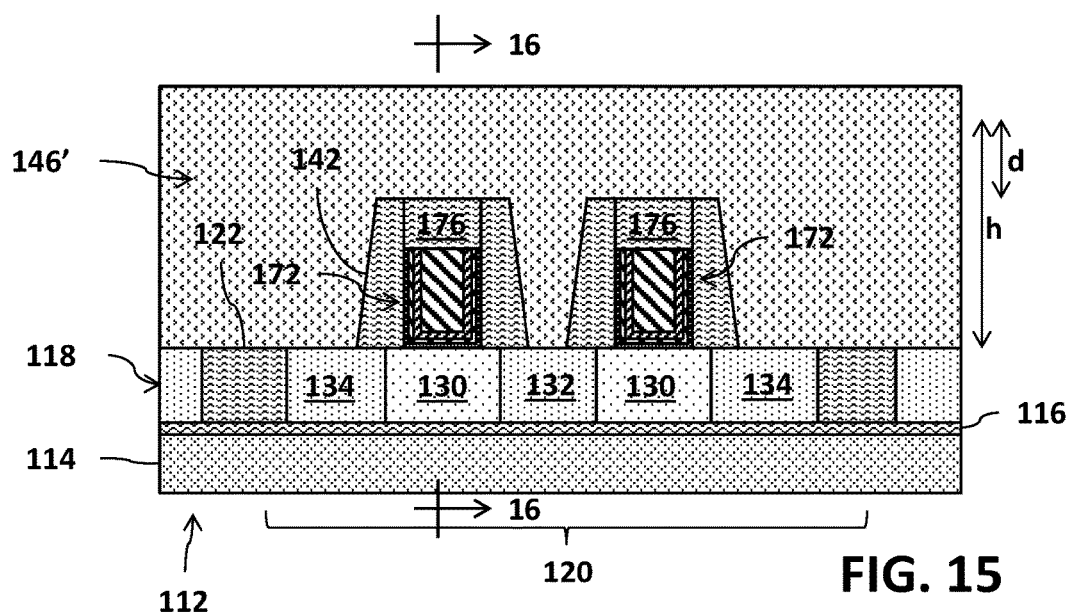
Figure 16:
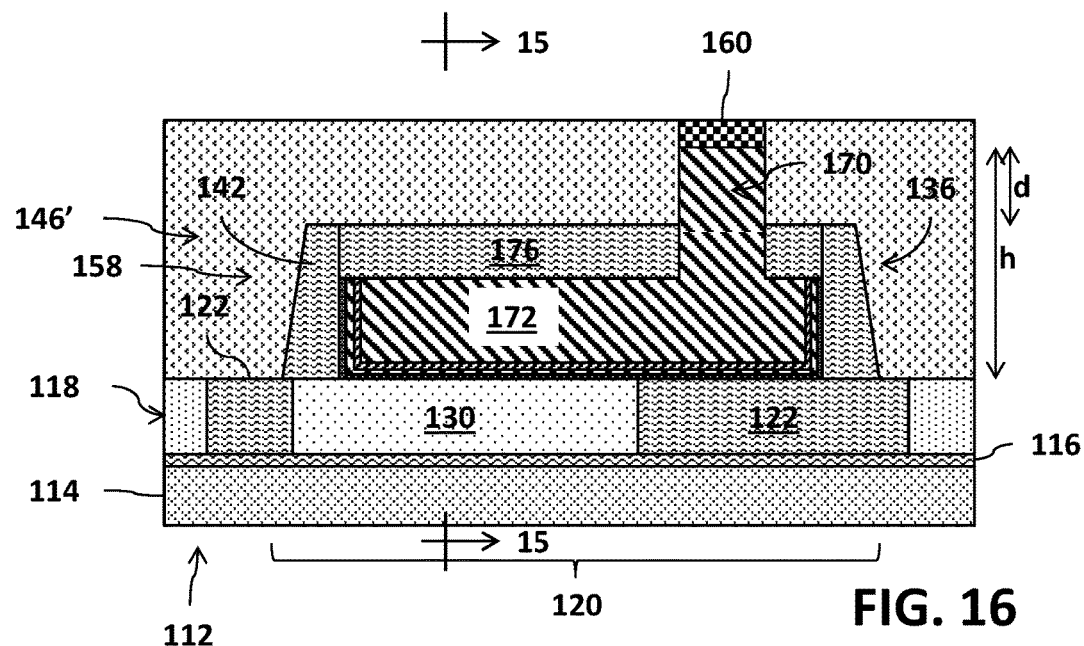
Figure 17:
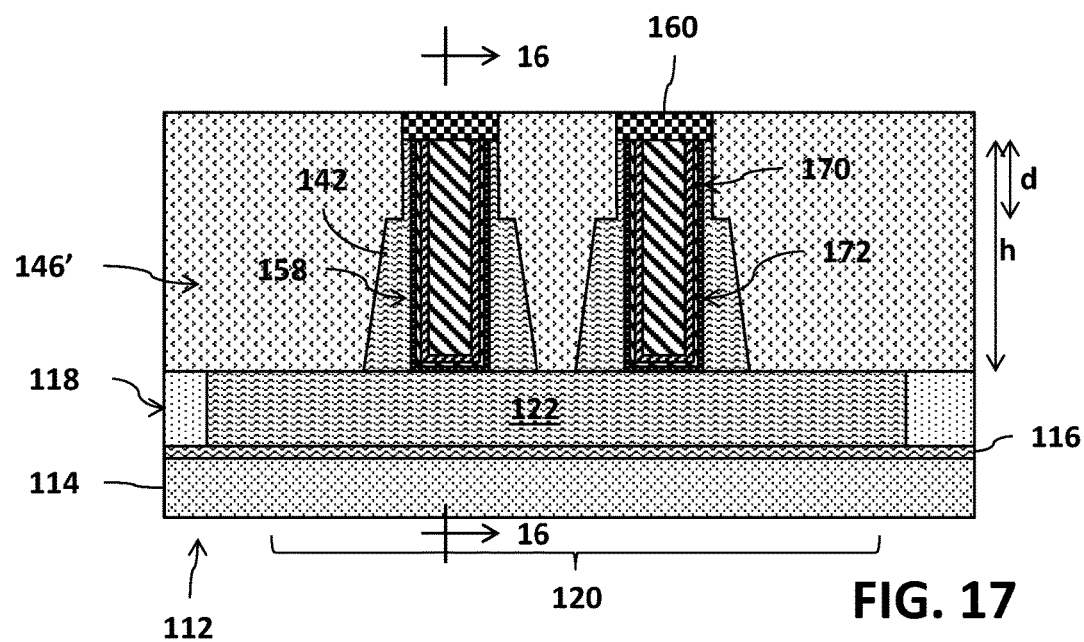

A deposit of a dielectric material is then made to cover the previously formed structures. This deposit may, for example, be made using a chemical vapor deposition process. The dielectric material may comprise, for example, an HDP oxide. A chemical-mechanical polishing (CMP) process is used to remove excess portions of the dielectric material deposit, with the polish stopping at the top of the blocking mask 160. The result is shown in FIGS. 15-17 to form an interlevel dielectric (ILD) or pre-metallization dielectric (PMD) layer 146'.

Figure 18:
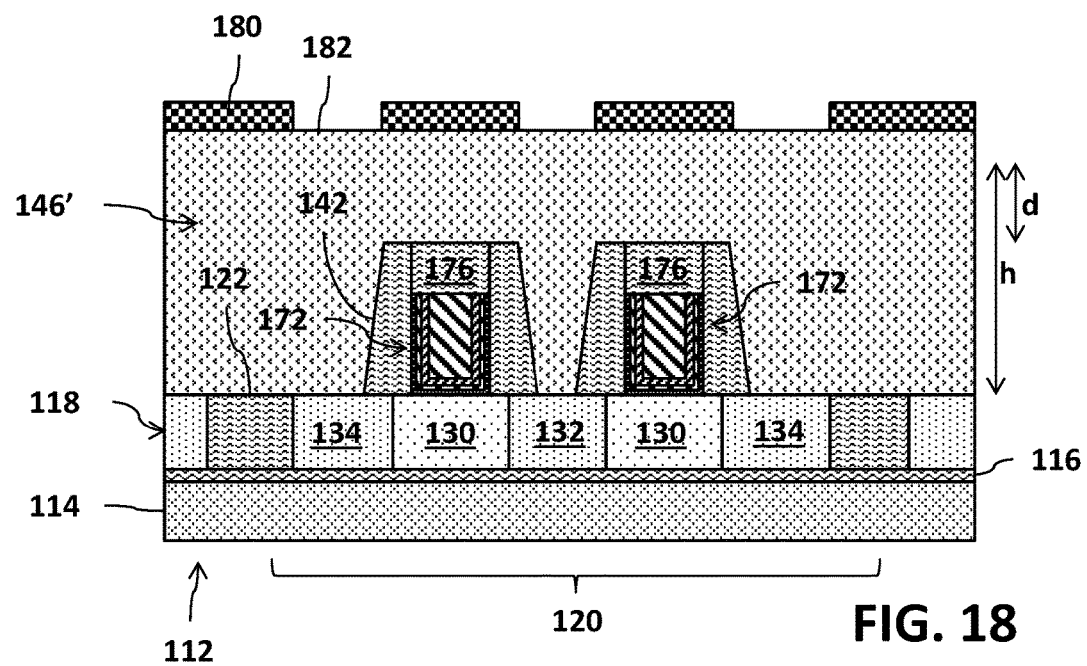

Using well known lithographic patterning techniques, an etch mask 180 is formed on a top surface 182 of the ILD/PMD layer 146' with mask openings at the locations for source and drain contacts. The result is shown in FIG. 18.

Figure 19:
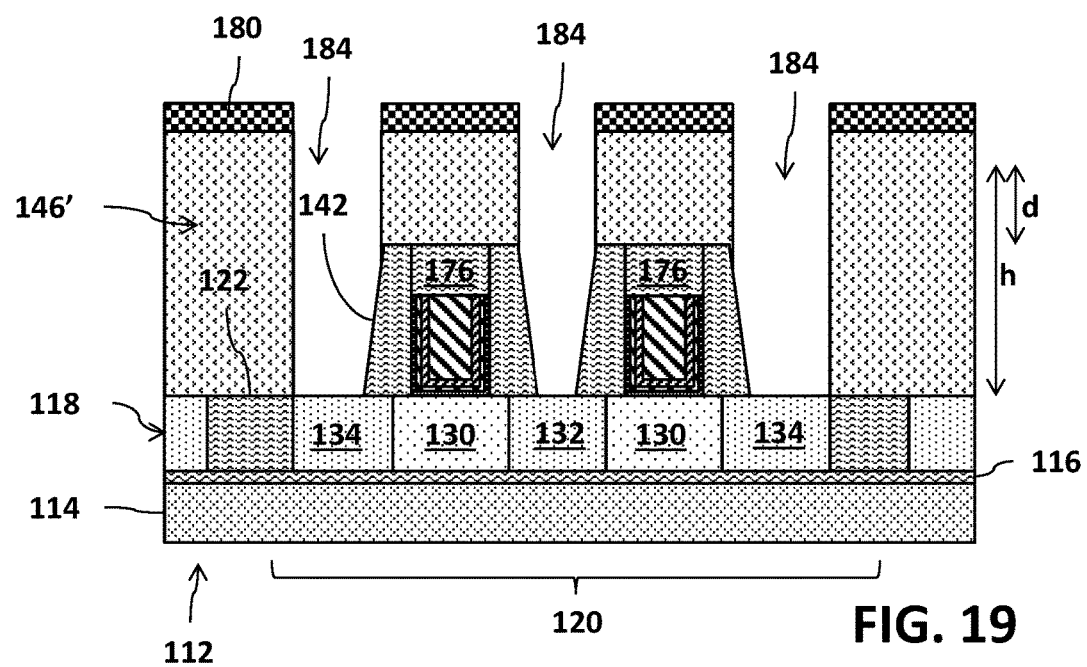

A reactive ion etch (ME) is then performed through the mask openings to form self-aligned contact openings 184 extending through the ILD/PMD layer 146' to reach the upper surface of the source and drain regions 132 and 134. The result is shown in FIG. 19. The etch mask 180 may then be removed.

Figure 20:
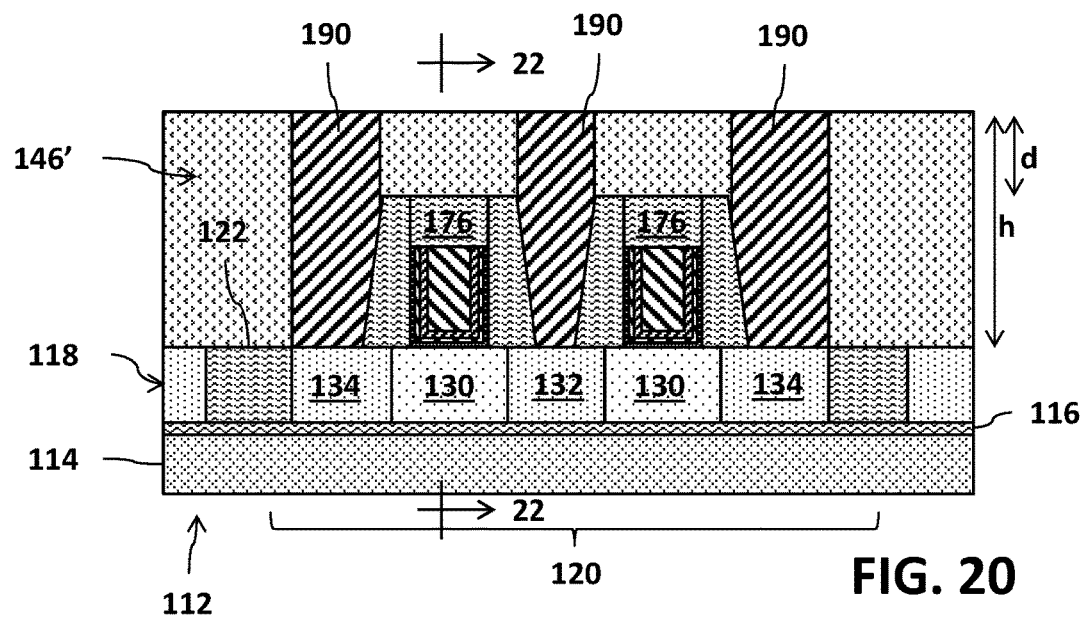
Figure 21:
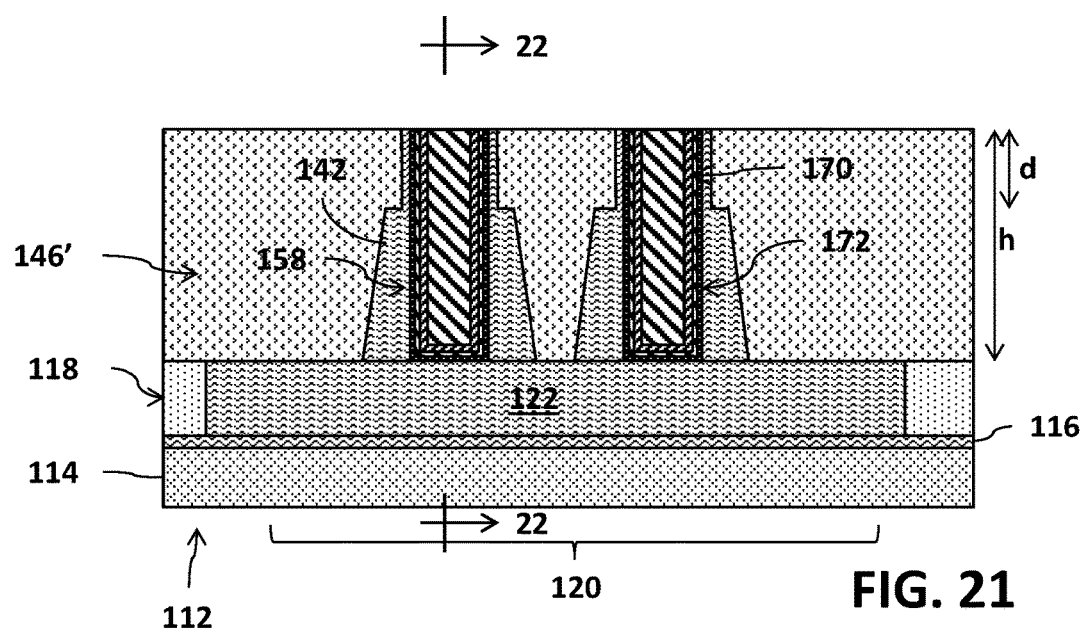
Figure 22:
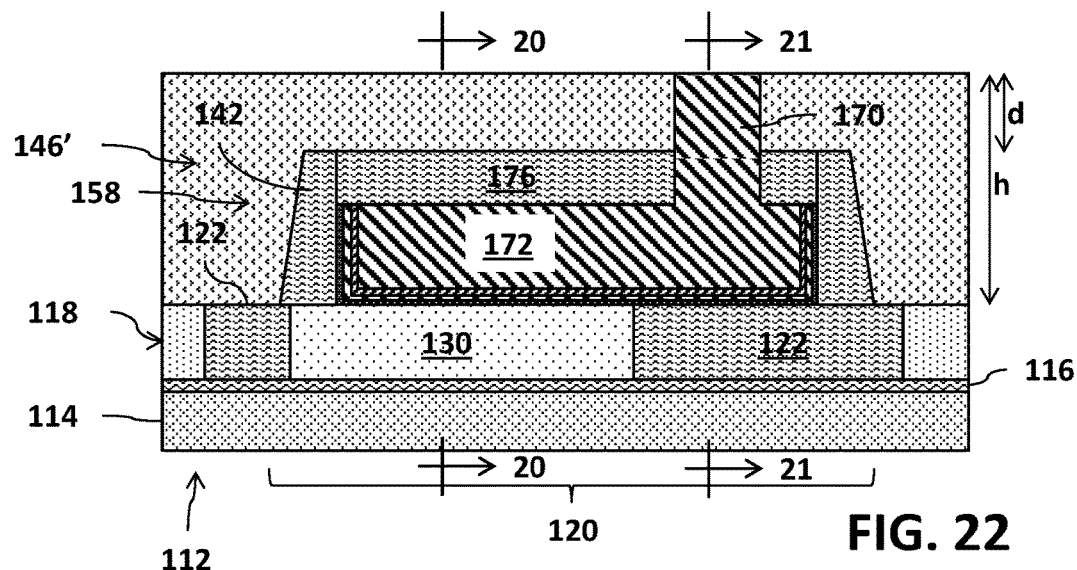
Figure 23:
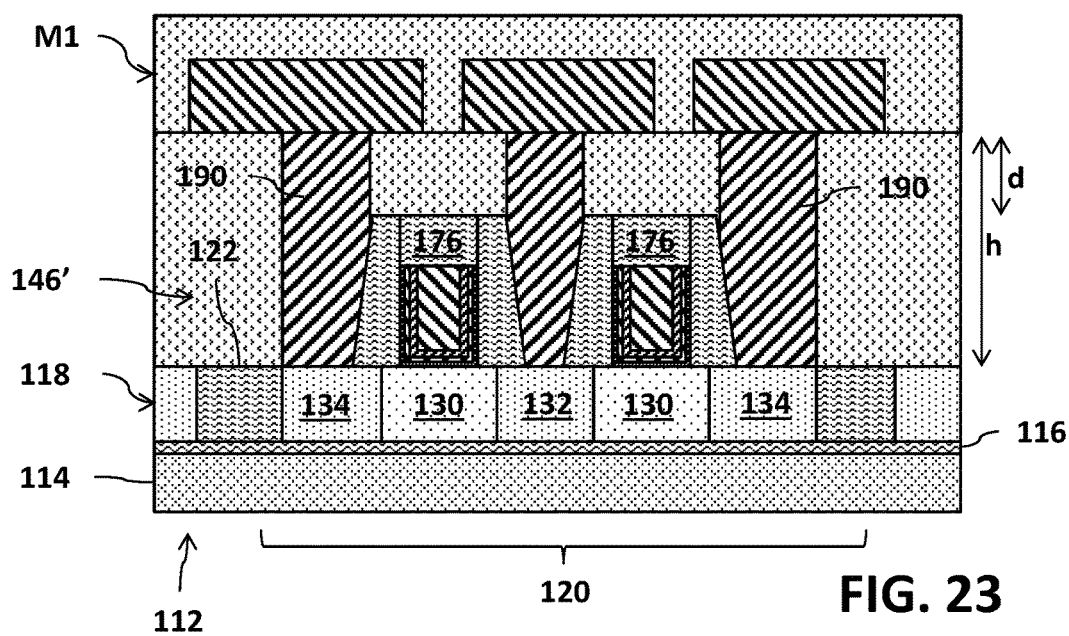
Figure 24:
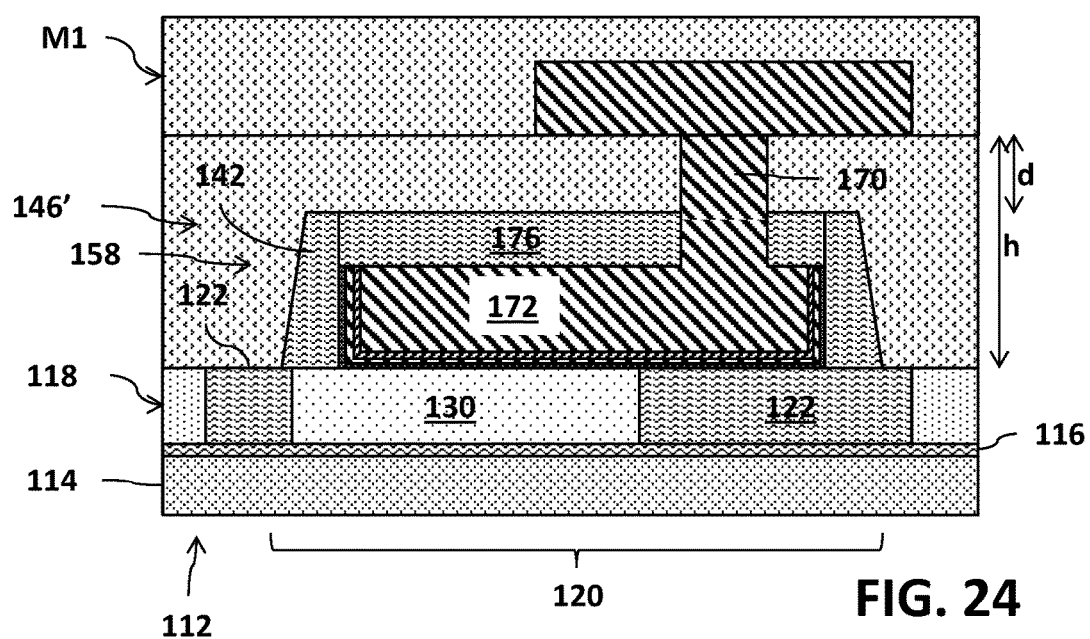

A metal contact 190 is then formed in each opening 184. The metal contact 190 may be made by first depositing a thin (3-8 nm) metal liner made, for example, of TiN using an atomic layer deposition process. A metal fill material is then deposited using a thermal chemical vapor deposition process. The metal fill material may, for example, comprise tungsten. A chemical-mechanical polishing (CMP) process is used to remove excess portions of the metal liner and metal fill, with the polish stopping after the blocking mask 160 has been removed (for example, at about a thickness equal to the height h). The result is shown in FIGS. 20-22.

Although not specifically illustrated, it will be understood that a metal silicide could be formed at the bottom of each contact opening 184 to improve contact resistance in making the electrical connection to the source and drain regions.

Conventional back-end-of-line (BEOL) structures such as metallization layers may then be formed on the top surface of the ILD/PMD layer 146' so as to electrically connect to the source, drain and gate contacts. See, for example, FIGS. 23-24.

The process and structure disclosed may be used in connection with the fabrication of a planar MOSFET device. As discussed above, the techniques and structures for contacts described herein are further applicable to a FinFET device, and may also be used in connection with other integrated circuit devices including, without limitation, bipolar transistor devices, diode devices, planar transistor devices with source and drain regions formed from UTBB or ETSOI substrates, and the like.

The preferred embodiments herein utilize substrates of the SOI-type, but it will be understood that a bulk substrate and substrates of other type can used as the foundations for building integrated circuits which utilize the fabrication techniques and structures disclosed herein.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    forming a dummy gate structure extending over a channel region, said dummy gate structure comprising a dummy gate electrode and sidewall spacers surrounding the dummy gate electrode and that extend over a source-drain region adjacent the channel region;
    removing the dummy gate electrode to form a first opening between the sidewall spacers;
    forming a replacement metal gate within the first opening, said replacement metal gate comprising a dielectric liner and a metal portion;
    block masking a portion of the replacement metal gate where a gate contact is desired; and
    recessing the replacement metal gate within the first opening except at said portion that is block masked to form a gate electrode where the replacement metal gate is recessed and further form said gate contact where the replacement metal gate is block masked.

2. The method of claim 1, wherein recessing the replacement metal gate further forms a second opening over the gate electrode between the sidewall spacers where the replacement metal gate is recessed, and further comprising filling the second opening with an insulating material covering the gate electrode.

3. The method of claim 1, wherein the dielectric liner is positioned between the gate electrode and the channel region, said dielectric liner extending between the gate electrode and the sidewall spacers and further extending between the gate contact and the sidewall spacers.

4. The method of claim 1, wherein a side surface of the gate electrode and a side surface of the gate contact are aligned with each other and extend parallel to an inner surface of the sidewall spacers.

5. The method of claim 1, further comprising:
providing a dielectric layer; and
forming a contact opening in the dielectric layer extending from a top surface of the dielectric layer to the source-drain region, said contact opening exposing an outer surface of the sidewall spacers, and filling said contact opening with a metal material to form a source-drain contact that is in contact with the outer surface of the sidewall spacers.

6. The method of claim 5, wherein the dielectric layer is one of an interlevel dielectric (ILD) layer or pre-metallization dielectric (PMD) layer.

7. The method of claim 5, wherein a height of the sidewall spacers is equal to a height of the dielectric layer.

8. The method of claim 5, further comprising forming a metallization layer on a top surface of the dielectric layer, said metallization layer including a metal line in contact with said gate contact.

9. The method of claim 1, further comprising using the block masking in performing an etch which thins the sidewall spacers at the gate contact.

10. The method of claim 1, wherein the channel region and source-drain region are part of a fin of semiconductor material.

11. A method, comprising:
forming a dummy gate structure extending over a channel region, said dummy gate structure comprising a dummy gate electrode and sidewall spacers surrounding the dummy gate electrode;
removing the dummy gate electrode to form a first opening between the sidewall spacers;
forming a replacement metal gate within the first opening, said replacement metal gate comprising a dielectric liner and a metal portion;
recessing a first portion of the replacement metal gate within the first opening to form a gate electrode, with a second portion of the replacement metal gate that is not recessed forming a gate contact; and
filling a second opening left by recessing the first of the replacement metal gate with an insulating material covering the gate electrode.

12. The method of claim 11, wherein recessing the first portion comprises:

block masking the second portion of the replacement metal gate; and
etching the replacement metal gate except at said second portion that is block masked.

13. The method of claim 12, wherein block masking comprises forming a block mask that covers said second portion of the replacement metal gate and further covers a portion of the sidewall spacers on opposite sides of the replacement metal gate, and further comprising recessing sidewall spacers except for the portion covered by the block mask.

14. The method of claim 13, wherein recessing sidewall spacers further comprises recessing a portion of the insulating material covering the gate electrode.

15. The method of claim 11, wherein the dielectric liner is positioned between the gate electrode and the channel region, said dielectric liner extending between the gate electrode and the sidewall spacers and further extending between the gate contact and the sidewall spacers.

16. The method of claim 11, wherein a side surface of the gate electrode and a side surface of the gate contact are aligned with each other and extend parallel to an inner surface of the sidewall spacers.

17. The method of claim 11, further comprising:
providing a dielectric layer; and
forming a contact opening in the dielectric layer extending from a top surface of the dielectric layer to a source-drain region adjacent the channel region, said contact opening exposing an outer surface of the sidewall spacers, and filling said contact opening with a metal material to form a source-drain contact that is in contact with the outer surface of the sidewall spacers.

18. The method of claim 17, wherein the dielectric layer is one of an interlevel dielectric (ILD) layer or pre-metallization dielectric (PMD) layer.

19. The method of claim 17, wherein a height of the sidewall spacers is equal to a height of the dielectric layer.

20. The method of claim 17, further comprising forming a metallization layer on a top surface of the dielectric layer, said metallization layer including a metal line in contact with said gate contact.

21. The method of claim 11, wherein the channel region and source-drain region are part of a fin of semiconductor material.

22. The method of claim 11, further comprising providing a dielectric layer having a top surface coplanar with a top surface of the sidewall spacers, and wherein a top surface of the gate electrode is below the coplanar top surfaces of the dielectric layer and sidewall spacers, and wherein a top surface of the gate contact is coplanar with the coplanar top surfaces of the dielectric layer and sidewall spacers.

23. The method of claim 1, further comprising providing a dielectric layer having a top surface coplanar with a top surface of the sidewall spacers, and wherein a top surface of the gate electrode is below the coplanar top surfaces of the dielectric layer and sidewall spacers, and wherein a top surface of the gate contact is coplanar with the coplanar top surfaces of the dielectric layer and sidewall spacers.

* * * * *

UNITED STATES PATENT AND TRADEMARK OFFICE
CERTIFICATE OF CORRECTION

PATENT NO. : 10,121,874 B2
APPLICATION NO. : 15/485754
DATED : November 6, 2018
INVENTOR(S) : John Hongguang Zhang Page 1 of 1

It is certified that error appears in the above-identified patent and that said Letters Patent is hereby corrected as shown below:

In the Specification

At Column 5, Line 65, please replace [[ (ME) ]] with -- (RIE) --.

Signed and Sealed this
Sixteenth Day of April, 2019

Andrei Iancu
*Director of the United States Patent and Trademark Office*